(12) United States Patent
Feno

(10) Patent No.: US 10,163,561 B1
(45) Date of Patent: Dec. 25, 2018

(54) DISTRIBUTED PLANAR INDUCTOR WITH MULTI-2D GEOMETRY FOR ENERGY STORAGE

(71) Applicant: PAI Capital LLC, Santa Clara, CA (US)

(72) Inventor: Ivan Feno, Bertschikon (CH)

(73) Assignee: Bel Power Solutions Inc., Santa Clara ( * ) Notice: Subject to any disclaimer, the term of this patent is extended or adjusted under 35 U.S.C. 154(b) by 53 days.

(21) Appl. No.: 15/180,598

(22) Filed: Jun. 13, 2016

Related U.S. Application Data

(60) Provisional application No. 62/266,373, filed on Dec. 11, 2015.

(51) Int. Cl.
*H01F 27/24* (2006.01)
*H01F 27/34* (2006.01)
*H01F 27/28* (2006.01)
*H05K 1/02* (2006.01)

(52) U.S. Cl.
CPC ........... *H01F 27/346* (2013.01); *H01F 27/24* (2013.01); *H01F 27/28* (2013.01); *H05K 1/0298* (2013.01); *H05K 2201/1003* (2013.01)

(58) Field of Classification Search
CPC ................. H01F 5/00; H01F 27/00–27/36
USPC .............. 336/65, 83, 200, 212, 232
See application file for complete search history.

(56) References Cited

U.S. PATENT DOCUMENTS

| | | | | |
|---|---|---|---|---|
| 4,447,795 A | * | 5/1984 | Sefko | ............ H01F 27/245 336/178 |
| 4,531,108 A | * | 7/1985 | Brandes | ............ H01F 27/245 336/178 |
| 5,146,198 A | * | 9/1992 | Pollard | ............ H01F 27/245 336/178 |
| 5,801,521 A | | 9/1998 | Mizoguchi et al. | |
| 6,967,553 B2 | | 11/2005 | Jitaru | |
| 6,980,077 B1 | | 12/2005 | Chandrasekaran et al. | |

(Continued)

OTHER PUBLICATIONS

Kirchenberger, Ulrich et al: "A Contribution to the Design Optimization of Resonant Inductors for High Power . Resonant DC-DC Converters", Institute of Electrical Drives, Technical University Munich, 1992, pp. 994-1001, 0-7803-0634-1/92$03.00 IEEE.

(Continued)

*Primary Examiner* — Tuyen Nguyen
(74) *Attorney, Agent, or Firm* — Patterson Intellectual Property Law, P.C.; Gary L. Montle

(57) ABSTRACT

A distributed planar inductor is provided with energy storage components featuring high energy storage density, multi-layer winding and low copper losses. The inductor includes a magnetic core with a plurality of vertically oriented posts, a plurality of horizontally oriented plates coupled to define an interior, and a conductive winding extending through the interior. The vertical posts each include a plurality of energy storage elements coplanar in orientation with respect to the winding and having a substantially two dimensional structure. The conductive winding may comprise co-planar winding tracks extending through the interior, for example vertically coupled in parallel. A set of co-planar winding tracks may correspond to respective layers in a multilayer printed circuit board, and for example may comprise printed circuit board tracks vertically interconnected by vias extending there-through.

18 Claims, 9 Drawing Sheets

(56) References Cited

U.S. PATENT DOCUMENTS

| | | | |
|---|---|---|---|
| 7,142,081 B1 * | 11/2006 | Shudarek | H01F 27/24 336/178 |
| 7,292,128 B2 | 11/2007 | Hanley | |
| 7,295,092 B2 | 11/2007 | Elliott et al. | |
| 7,353,587 B2 | 4/2008 | Vinciarelli et al. | |
| 2013/0207767 A1 * | 8/2013 | Worthington | H01F 27/2804 336/84 C |

OTHER PUBLICATIONS

Severns, Rudy: "Additional Losses in High Frequency Magnetics Due to Non Ideal Field Distributions", 1992, pp. 333-338, 0-7803-0485-3/92$3.00 IEEE.

* cited by examiner

DISTRIBUTED PLANAR INDUCTOR WITH MULTI-2D GEOMETRY FOR ENERGY STORAGE

CROSS-REFERENCES TO RELATED APPLICATIONS

This application claims benefit of U.S. Provisional Patent Application No. 62/266,373, filed Dec. 11, 2015, and which is hereby incorporated by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

This invention relates generally to electrical power conversion methods and circuits, and more particularly to inductors with reduced AC losses.

Current source inverters are typical building blocks for many power converters. This kind of inverter typically includes a voltage inverter (e.g., having a bridge/half bridge configuration) and a current defining element, such as an AC choke. Typical applications include series resonant converters where the current source inverter represents a substantial part of the primary circuitry. An inductive choke is also a part of the inverter and typically consists of a magnetic core and a winding.

The energy density of a magnetic field $u_B$ is defined by equation (1). In order to achieve a compact and a high density inductor, a volume with a maximum $u_B$ may ideally be created.

$$u_B = (1/2_\mu) B^2 \qquad (1)$$

A magnetic core provides significant assistance in achieving the high energy density because the flux (represented by its flux density B) can be shaped and concentrated, and can flow through a low permeability space. This may be rather difficult to achieve in, e.g., an air inductor. For high frequency applications, a ferrite is conventionally the material used, examples of which may include soft ferrites such as manganese-zinc ferrite, nickel-zinc ferrites, lithium-zinc ferrites, and the like. Based on the selected material, frequency and target core loss density, the amplitude of the flux density B ($\Delta B$ respectively) can be derived. This yields a certain maximum flux density B limiting the magnetic field $u_B$. Looking again to equation (1), a second possibility for increasing the energy density is the permeability $\mu$ of the space where the flux B·A (A=cross section area) is allowed to flow. Generally speaking, for smaller permeability, the obtained energy density may correspondingly be larger. The best results are therefore achieved with air because its permeability approaches $\mu_0$. Taking into account some real numbers (Ba=50 mT, $\mu_0 = 4\pi \cdot 10^{-7}$ H/m), equation (1) yields 995 J/m³ which approximately represents an energy density limit for a typical magnetic device with a ferrite core operated at a flux density of 50 mT. One of skill in the art may further appreciate that the stored energy is in the field of the air gap ($\mu=1$) and not in the core ($\mu \gg 1$).

Because the current through an inductive choke typically contains a significant AC component, a litz wire is often used to wind a coil so that skin and proximity effects are minimized. However, litz wires are generally not suitable for planar structures where the winding is, e.g., integrated into a multilayer printed circuit board ("PCB") as copper planes or copper tracks. These objects suffer from AC losses due to eddy currents which are mainly caused by: 1) a fringing field from the air gap; and 2) the skin and proximity effects due to other windings. Because of this, the space where the energy is stored must have sharp boundaries, or otherwise the field 24 leaks out and can cause eddy currents in windings as represented for example in FIG. 10.

With exemplary reference to FIGS. 1 and 2, those of skill in the art have previously implemented a distributed gap 13 with respect to a core 11 and one or more conductors 12 in planar magnetics as an efficient way to achieve a controlled behavior for the fringing field. The problem of the uniformly distributed gap is that for high frequency applications a ferrite base material would need to be used in conjunction with a resin. However, ferrite base materials have relatively high associated losses, and other standard distributed gap materials do not provide sufficiently low losses when used at high frequencies.

Referring now to FIGS. 3 and 4, an alternative group of solutions as previously known in the art propose a structure 10 with a uniformly distributed gap 13, or a "quasi-distributed air gap". In other words, an otherwise distributed air gap may be divided into multiple smaller gaps.

Referring next to FIG. 5, another conventional solution for minimizing AC losses in planar inductors and integrated magnetics 10 includes a core 11 which is suitable for high current low frequency applications where the gap is filled with a composite material 13 made of high saturation low frequency powder material. More specifically, such a structure may be suitable for converters with integrated magnetics and matrix integrated magnetics (MIMs).

Referring next to FIG. 6, a storage magnetic element is known in the art which seeks to minimize the power loss in the planar winding due to the fringing magnetic field associated with a discrete air gap. A magnetic core 11 is formed by an E section 11b made of high permeability magnetic material and an I section 11a made by a material capable of storing energy due to its distributed gap structure 13. This kind of design also requires a distributed gap material which is usually suitable only for high flux and low frequency applications.

Referring next to FIG. 7, another conventional application of a magnetic core includes a substrate with magnetically permeable material that has a first region 15a and a second region 15b near the first region. Support is provided to maintain a juxtaposition between the first region and the second region, and a slit 16 is formed through the magnetically permeable material between the first region and the second region. A binding agent is introduced into the slit and the support may then be removed, wherein the binding agent maintains the juxtaposition between the first region and the second region after the support is removed. This process is single sided, and therefore energy storage is limited unless physical dimensions are enlarged. Therefore, the final component may be suitable for rather small power applications.

Referring next to FIG. 8, another example of a planar magnetic element may include a substrate 17 and a protection layer 18, with magnetic layers 19, insulators 20 and planar coils 12 disposed between the substrate and the protection layer. However, magnetic layers are only with difficulty included in the PCB, and therefore this approach is not eligible for cost optimized high density PCB based converters.

Referring still further to FIG. 9, a single piece core structure for magnetic components is known in the art which does not require insulating spacer materials and bonding materials. This approach includes a monolithic core structure 10 fabricated from a magnetic material 22, a gap 21 integrally formed in the body and a conductive element 12 establishing a conductive path configured for surface mount termination. This design for surface mount components may typically be used in low voltage high current point of load ("POL") converters. There are numerous potential problems with such a configuration, however. For example, the monolithic structure of the core does not allow the use of planar PCB windings, an important factor for compact converters because the PCB windings cannot be inserted into the monolithic core structure. Any other ways to build a high voltage winding (e.g., for 400V applications) may generally be difficult and/or unreliable due to the risk of isolation breakdown. Further, the manufacturing process for such a structure requires a certain minimum thickness of the non-magnetic ceramic layer for the gap (21), which is less than optimal to the formation of energy storage geometry as discussed herein, supra. The construction for the conductive element is also unsuitable for high frequency operation because the skin effects may generally lead to reduced copper usage and therefore significant power losses. Finally, the structure does not typically allow for inductance trimming as essential for certain type of converters, where the core is sintered together with the gap and therefore a smaller tolerance of inductance cannot be achieved.

The aforementioned solutions as conventionally known in the art for dealing with the fringing magnetic field may each therefore be characterized as suffering from one or more following problems: (a) the energy storage density is low, (b) the inductance cannot be trimmed, or (c) a uniformly distributed gap material for low frequency high flux density is used.

It would therefore be desirable to provide a compact high density planar converter which adequately targets each of these features.

BRIEF SUMMARY OF THE INVENTION

In accordance with various embodiments of an inductive apparatus as disclosed herein, a substantially planar energy storage component is introduced featuring a high energy storage density, multilayer winding and low copper losses. The associated magnetic flux is shaped and fed through a large number of thin energy storage elements.

Such a configuration may generally overcome a problem known in the art, namely, wherein substantially planar (2D-like) energy storage elements typically have a very limited volume and hence the integral of energy stored in such a space is rather small.

In a particular embodiment, an inductive apparatus as disclosed herein may include a magnetic core with a plurality of vertically oriented posts, a plurality of horizontally oriented plates coupled to define an interior, and a conductive winding extending through the interior. The vertical posts each include a plurality of energy storage elements coplanar in orientation with respect to the winding and having a substantially two dimensional structure.

In one exemplary aspect, the apparatus may be configured wherein each of the plurality of energy storage elements comprise gaps having a non-magnetic material disposed between adjacent portions of the respective vertical posts. The energy storage elements may further be disposed between each vertical post and respectively adjacent horizontal plates.

In another aspect, the conductive winding may comprise one or more co-planar winding tracks extending through the interior. In one example, a set of co-planar winding tracks are coupled in parallel along a single horizontal layer. In another example, a set of co-planar winding tracks are vertically coupled in parallel.

In another aspect, the set of co-planar winding tracks may correspond to respective layers in a multilayer printed circuit board. For example, the plurality of co-planar winding tracks may comprise printed circuit board tracks vertically interconnected by vias extending there-through.

In another aspect, the conductive winding may have a physical thickness corresponding to a skin depth for the winding.

In another embodiment, the magnetic core may be comprised of a plurality of horizontally oriented plates and a plurality (n) of vertically oriented posts coupled to define a plurality (n−1) of interior portions, wherein a plurality of isolated conductive windings extend through the plurality of interior portions.

In one aspect of such an embodiment, adjacent interior portions may have a shared vertical post there-between, and each shared vertical post and corresponding energy storage elements may have cross-sections substantially larger than the respective cross-sections of unshared boundary vertical posts and corresponding energy storage elements.

DETAILED DESCRIPTION OF THE INVENTION

Figure 1:
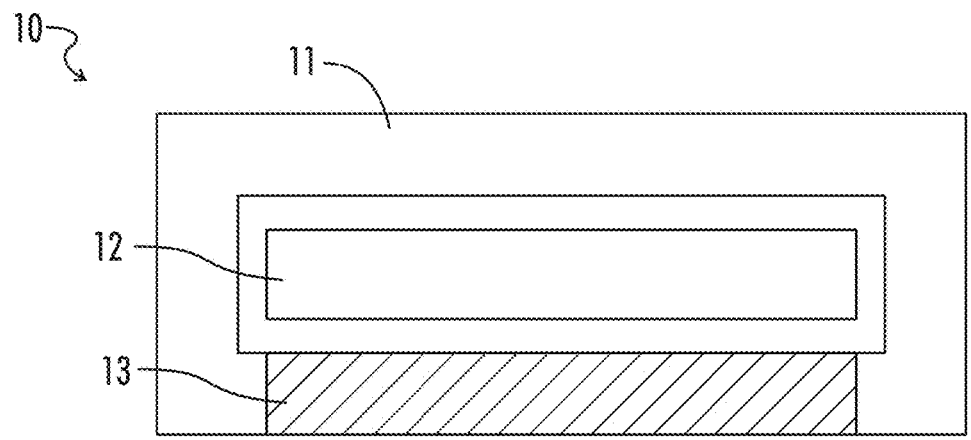
FIGS. 1-10 are diagrams representing examples of magnetic devices as previously known in the art.
Figure 2:
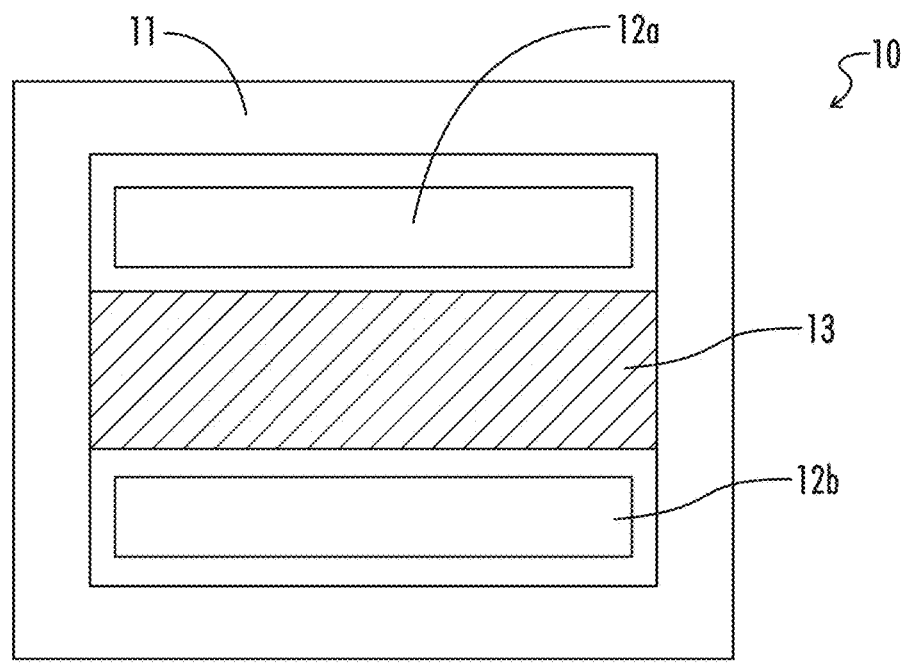
Figure 3:
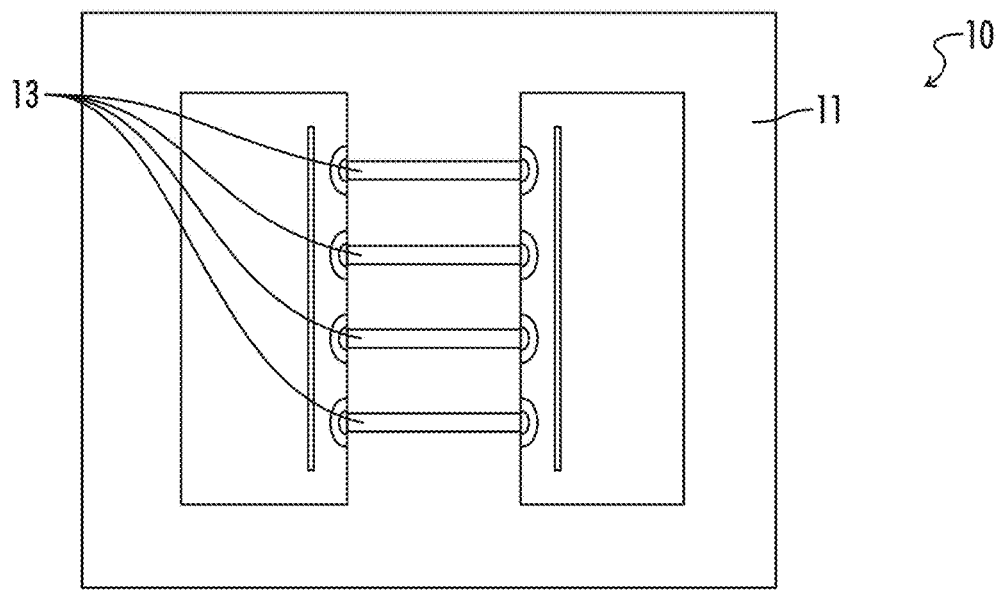
Figure 4:
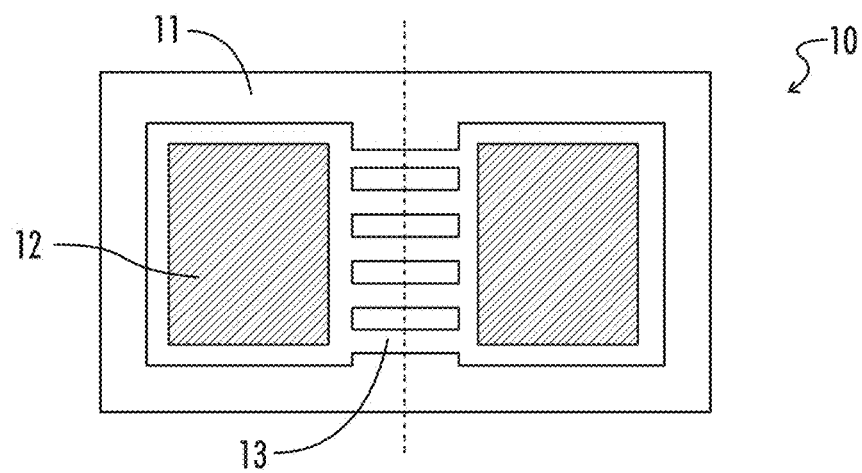
Figure 5:
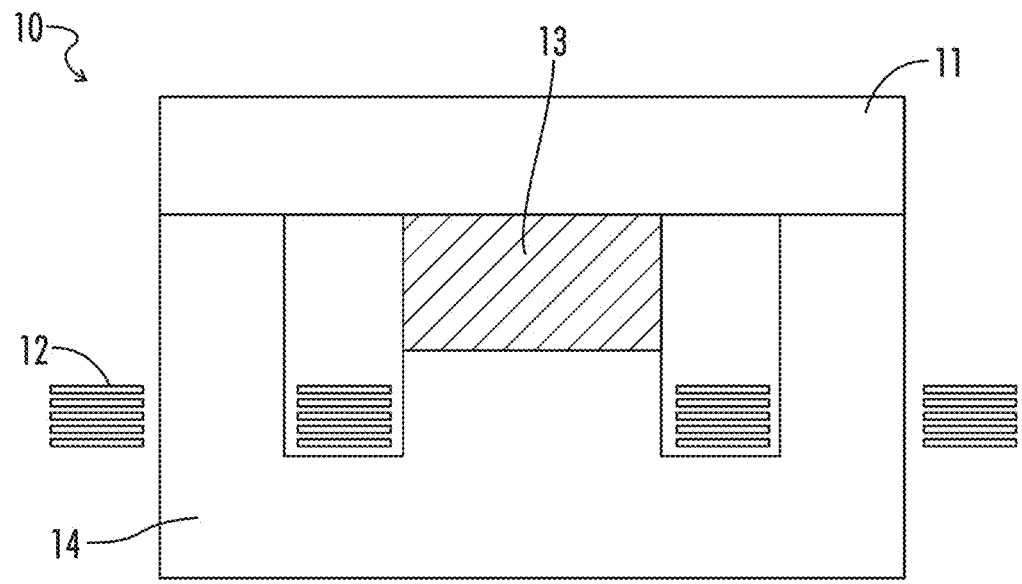
Figure 6:
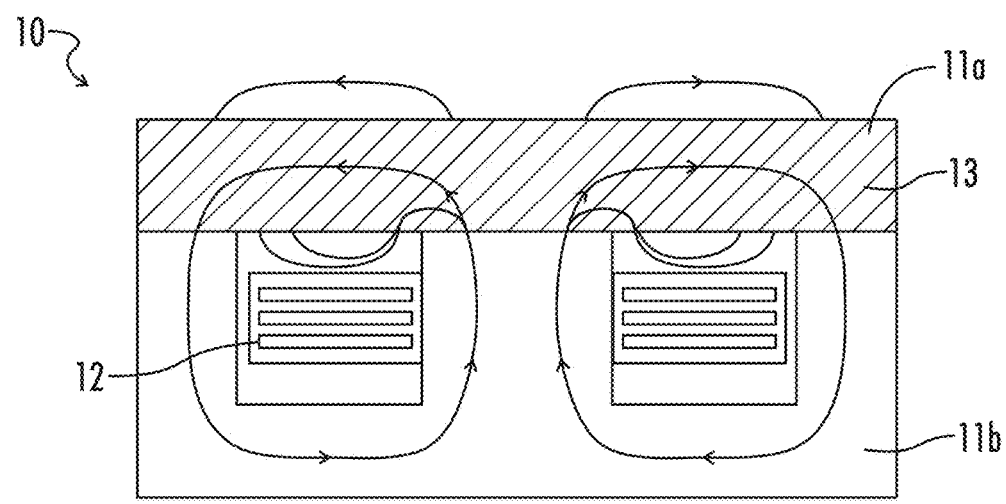
Figure 7:
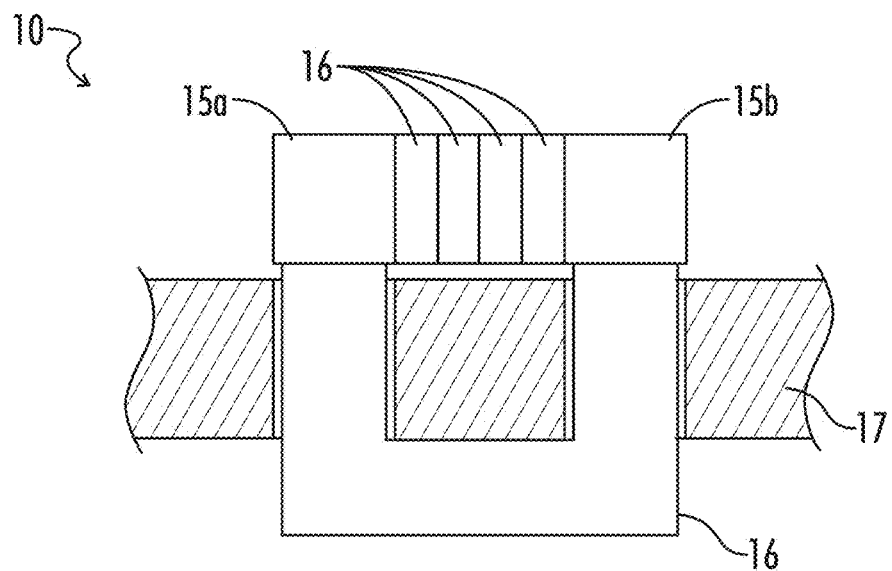
Figure 8:
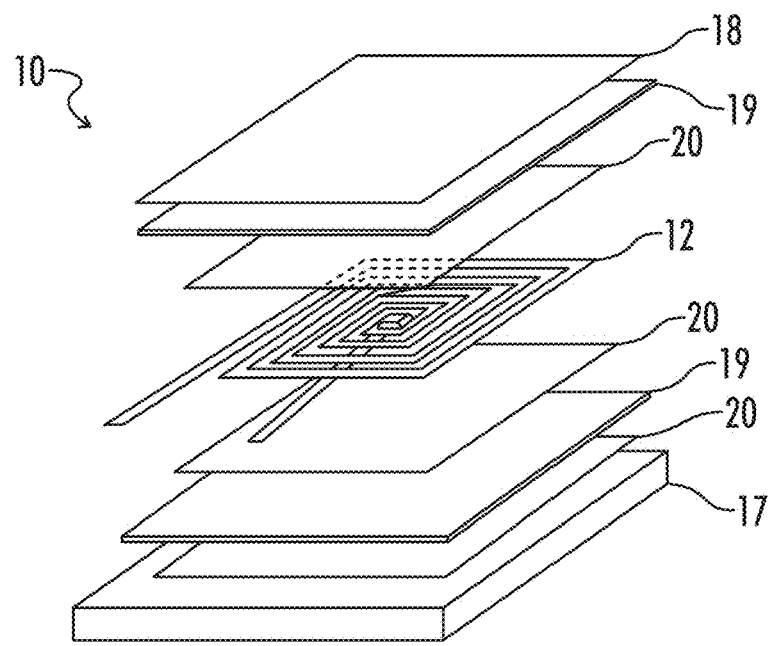
Figure 9:
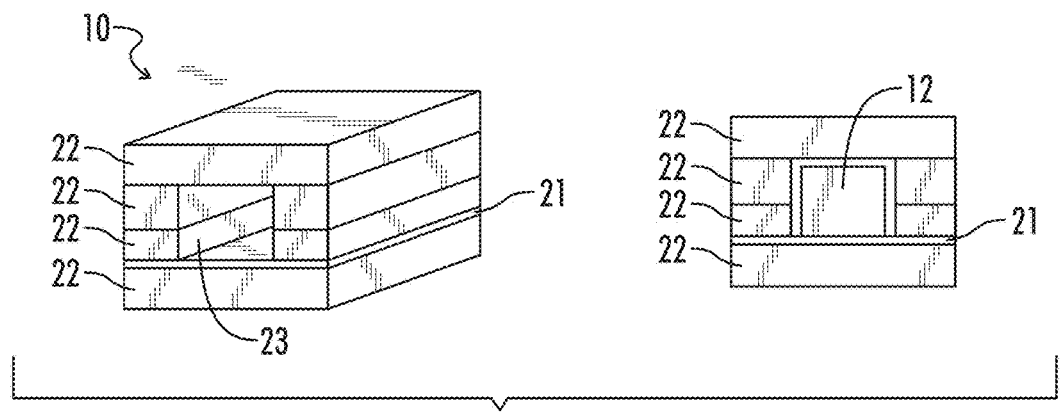
Figure 10:
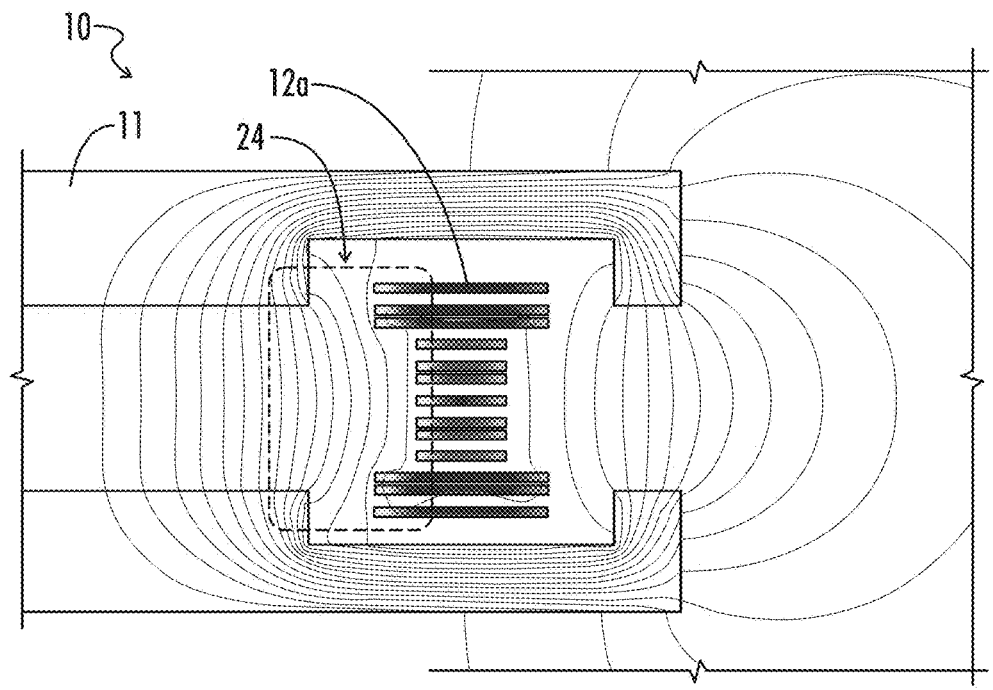

Referring generally to FIGS. 11-18, various exemplary embodiments of an inductive apparatus may now be described in detail. Where the various figures may describe embodiments sharing various common elements and features with other embodiments, similar elements and features are given the same reference numerals and redundant description thereof may be omitted below.

Generally speaking, when confronted with an objective of compactness and requirement of sharp boundaries, one of skill in the art may conclude that a space where energy is stored should have essentially a zero height because this is the geometrical shape with the sharp field boundary and a homogenous energy density. Once the gap begins to assume a substantial third dimension, the field begins to leak out, and therefore from this point of view the optimal energy storage element is a planar element. As previously noted, the problem with such a configuration is that the planar energy storage element has a very limited volume and hence the integral of energy stored in such a space is rather small.

As discussed herein, the terms "horizontal" and "vertical" may be used to describe orientations of an inductive apparatus or components thereof relative to, for example, a multilayer PCB associated with the apparatus. "Horizontal" may generally correspond to a lateral plane with respect to a face of a top layer for the PCB, while "vertical" may generally correspond to a transverse plane with respect to the face of the top layer of the PCB. A "planar" element as disclosed herein may further typically be configured so as to decrease a vertical component for the element as much as possible, such that the element is substantially two-dimensional in configuration and orientation. One of skill in the art may appreciate that some degree of vertical component, or thickness, for the element is necessary, as otherwise no energy can be stored in the energy storage elements for the purposes and functions as disclosed herein. Therefore, the term "substantially two-dimensional" as used herein may be understood to describe an element having a relatively insignificant but effective thickness for the purposes of energy storage, which in one embodiment may be within a range for example from 25 um to 150 um.

Figure 11:
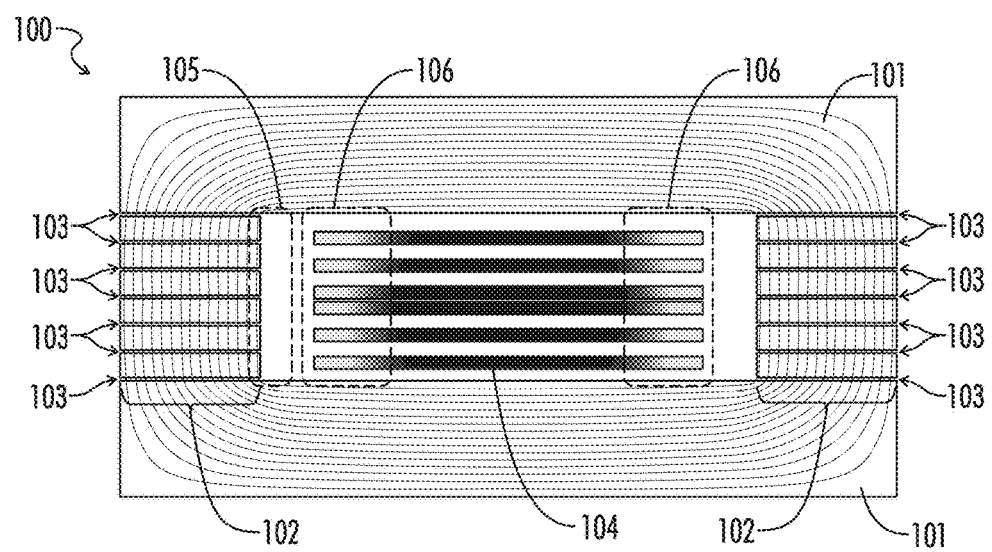
FIG. 11 is a diagram representing an embodiment of an inductive apparatus according to the present disclosure.

Referring first to FIG. 11, an embodiment of an inductive apparatus 100 as disclosed herein shapes and feeds the magnetic flux through a number of thin energy storage elements 103. The apparatus includes horizontal plates 101, vertical posts 102 and a planar winding 104. The vertical posts contain the energy storage elements 103 which are in the cross sectional view displayed as line slots.

In an embodiment, the energy storage elements may extend substantially or entirely through the associated vertical posts, or otherwise through a coupling of a vertical post and an adjacent portion of a horizontal plate. The planar winding 104 is located in the opening of the core. Because the energy is stored in elements with a substantially two-dimensional configuration, the flux does not leak out (105) and the eddy currents in the windings due to fringing field are minimized. High energy storage may therefore be achieved with a large number of elements distributed in the vertical posts, so that the total energy stored in this inductive component can be correspondingly large.

Depending on an associated working frequency and physical dimensions, one of skill in the art may appreciate that the current density in the copper winding will increase towards the edges 106 of the winding due to AC magnetic field in the winding space causing eddy currents resulting in skin and proximity effects. Therefore, in various embodiments of an apparatus as disclosed herein, the physical thickness of the planar winding may be configured to be similar to the skin depth. The term "skin depth" as used herein may be understood as by one of skill in the art, i.e., the distance from a surface of the winding to a point where the current density is 1/e times the surface current density (where e is the natural log base).

In certain contexts, the current density in the winding may nevertheless be undesirably high. In such cases, multiple tracks may be connected in parallel. However, coupling multiple tracks in parallel on the same layer effectively results in a single wide track, wherein the same behavior is obtained and edges of the track would again suffer from current crowding.

Figure 12:
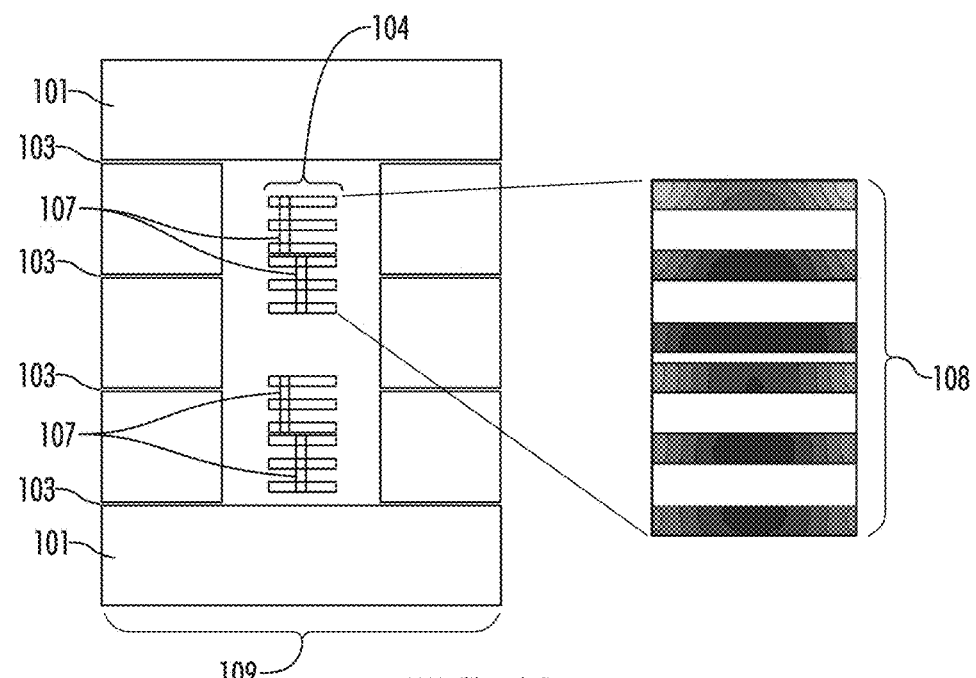
FIG. 12 is a diagram representing another embodiment of an inductive apparatus according to the present disclosure.

In another embodiment, as represented for example in FIG. 12, superior results may be achieved with a vertical orientation of the tracks 104 in parallel with each other. With an optimized design, the current density within the tracks has quite a reasonable distribution 108 without significant fringing, and hence provides a good copper usage and low power losses. One of skill in the art may further appreciate that where the total magnetomotive force may change as a result of the vertical parallel orientation, various design elements may correspondingly be adjusted (e.g., cross sectional area of the core, number and physical dimensions of energy storage elements, etc.).

Figure 13:
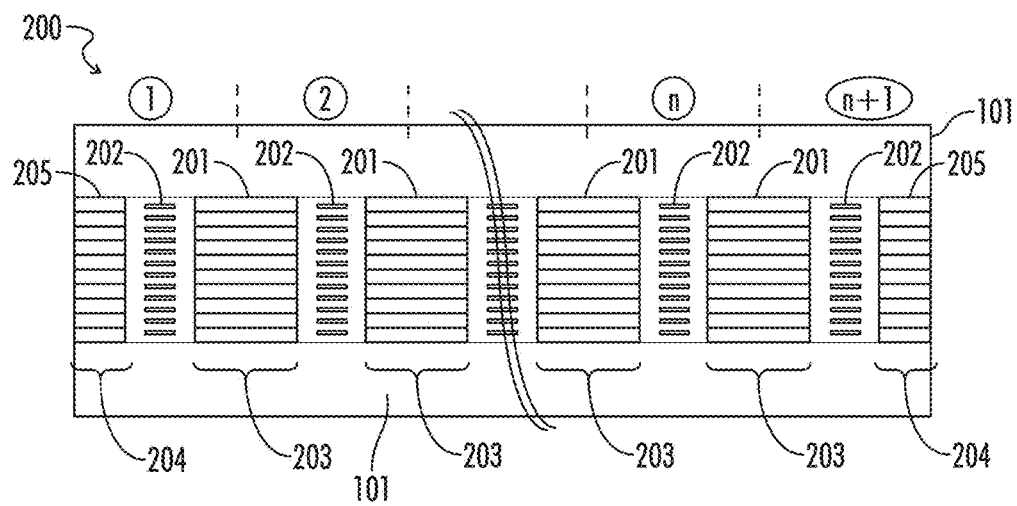
FIG. 13 is a diagram representing another embodiment of an inductive apparatus according to the present disclosure, characterized by a matrix-like field of energy storage elements interleaved with coplanar conductors.

For certain applications, still further additional increases in energy storage capability may be required, especially when technological limits of the multilayer PCB are taken into account. In an exemplary embodiment as represented in FIG. 13, the basic inductive element 109 of FIG. 12 is modified to provide a cascaded inductive apparatus 200. Each basic inductive element 1, 2, . . . n+1 may accordingly be configured so as to share adjacent vertical posts 203 with its respective neighbor element.

With this configuration, any number of elements can be cascaded to achieve relatively high energy storage. The resulting inductive component 200 may further be characterized by a matrix-like field of energy storage elements 201, 205 interleaved with coplanar conductive windings 202 in the cross sectional view.

In various embodiments, the number of energy storage elements may be larger, smaller, or equivalent to the number of coplanar conductors.

The boundary (i.e., peripheral) energy storage elements 205 of the generated inductive component 200 may in various embodiments have a smaller cross sectional area compared with the internal energy storage elements 201.

In an embodiment, the winding tracks 202 are oriented in parallel (i.e., in the same plane) with the energy storage elements 201, 205. This orientation may typically provide a superior fringing field immunity in the event that some field still leaks out of energy storage elements, for example due to very limited space available between the edge of energy storage elements and the winding edge. Vertically positioned windings, or any configuration where the energy storage elements are perpendicular to a winding plane, may generally expose a larger volume of the conductive material to the fringing field and hence cause a higher power loss.

Figure 14:
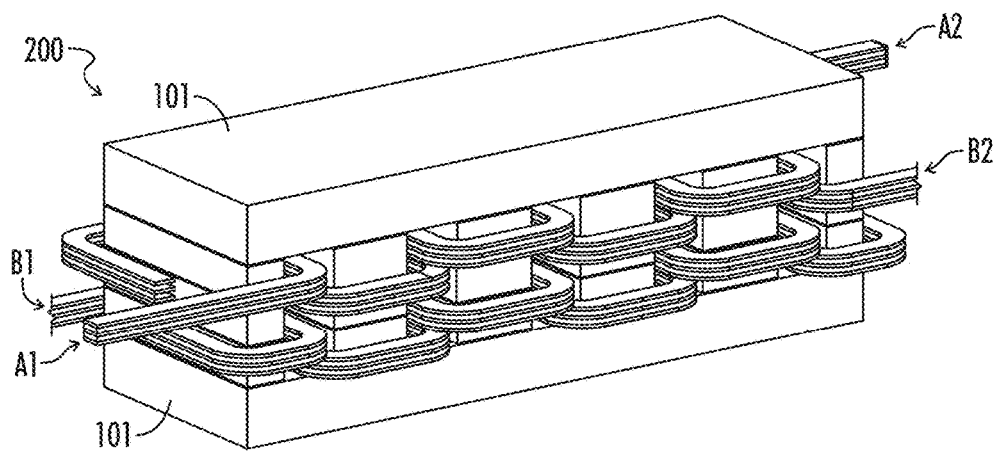
FIG. 14 is a three-dimensional view of an inductive apparatus according to the exemplary embodiment represented in FIG. 13.

Referring next to FIG. 14, a three-dimensional perspective view of the exemplary embodiment of the distributed planar inductor 200 is represented with five cascaded basic elements. The inductive apparatus 200 includes first and second vertical posts 204 on opposing ends, top and bottom horizontal plates 101, four internal vertical posts 203, and a winding 202 as described in the cross sectional view of FIG.

13. The vertical posts 203, 204 include numerous thin energy storage elements distributed therein.

Figure 15:
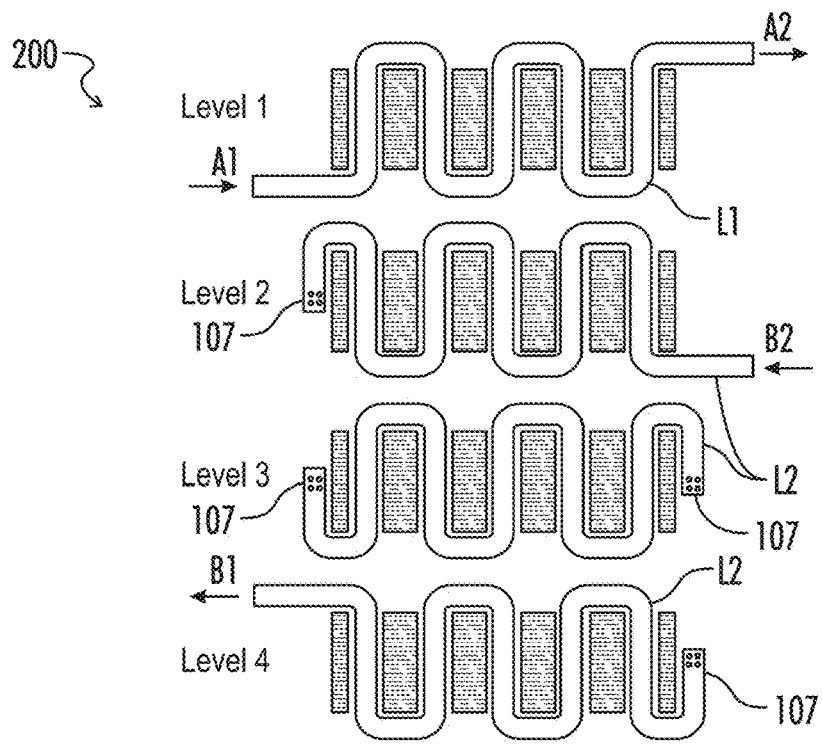
FIG. 15 is a cross-sectional view in the X-Y plane of an inductive apparatus according to the exemplary embodiment represented in FIG. 13.

With further reference to FIG. 15, an X-Y cross section is depicted for the exemplary embodiment represented in FIGS. 13 and 14. The winding 202 of the inductor is split into two isolated windings L1 and L2 passing through openings in the core (defined with respect to vertical posts 203, 204 and horizontal plates 101). The first winding L1 has only a single segment located on Level 1 and has first and second terminals A1 and A2, respectively. The second winding L2 has three segments distributed across Levels 2, 3 and 4, and has first and second terminals B1 and B2, respectively. Note that each Level may be comprised of several conductors connected in parallel with vias 107 as shown in FIG. 12. Hence, there are four winding segments in total, and each winding segment contains three PCB tracks vertically interconnected with vias 107 and thereby corresponding to a twelve layer PCB.

As the number of winding segments may otherwise be limited by the number of available PCB layers available, if a particular PCB design does not support a desired range (e.g., twelve layers) of winding segments or where additional winding segments are required for an alternative configuration, in an embodiment the available number of winding segments may be increased by attaching supplemental substrates (e.g., daughter boards) having a cumulative number of layers corresponding to the unaccounted-for winding segments and relative to the position of winding segments already disposed on the PCB.

Figure 16:
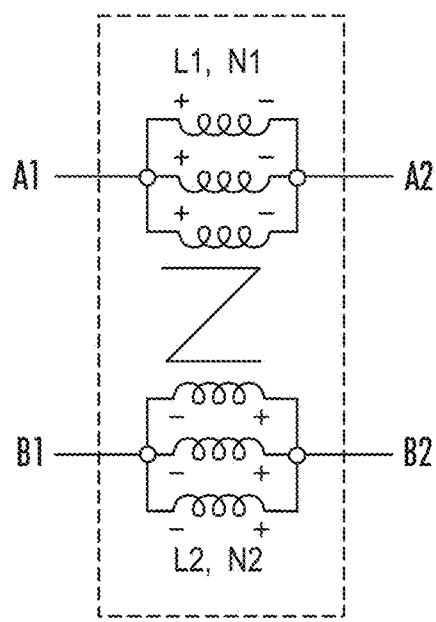
FIG. 16 is a schematic representation of the inductive apparatus according to the exemplary embodiment represented in FIG. 13.

With further reference to the schematic representation of FIG. 16, the winding L1 has N1 turns and the winding L2 has N2 turns. In this particular example N1≠N2 and therefore inductances L1 and L2 are not equal. Other embodiments are also possible where N1=N2.

In various embodiments, the number of vertical core posts, the number of tracks connected in parallel, and the number of turns of the windings can be larger or smaller than as represented herein without departing from the spirit of the invention.

Figure 17:
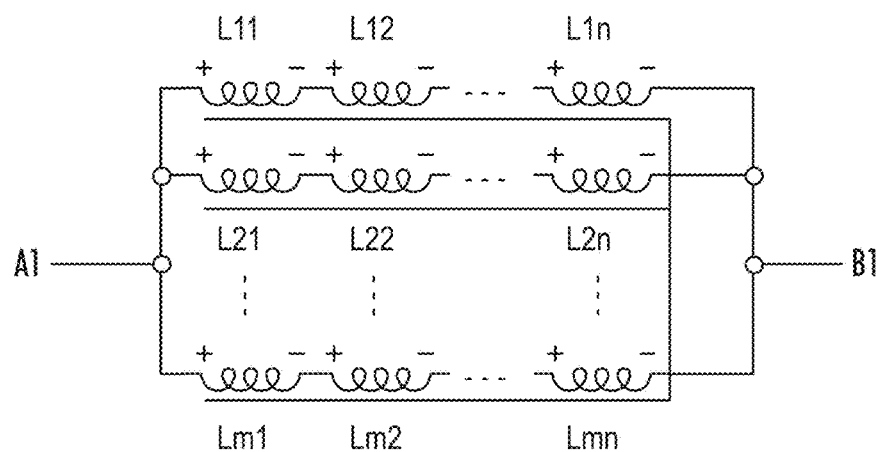
FIG. 17 is a schematic representation of the inductive apparatus according to the exemplary embodiment represented in FIG. 13, with two terminals.

In an alternative embodiment as represented in FIG. 17, terminals A2 and B2 are interconnected so that only terminals A1 and B1 are used. In this case, the elements Lx1 . . . Lxn represent the segments of the winding connected in series wherein {x} represents the tracks connected in parallel.

Figure 18:
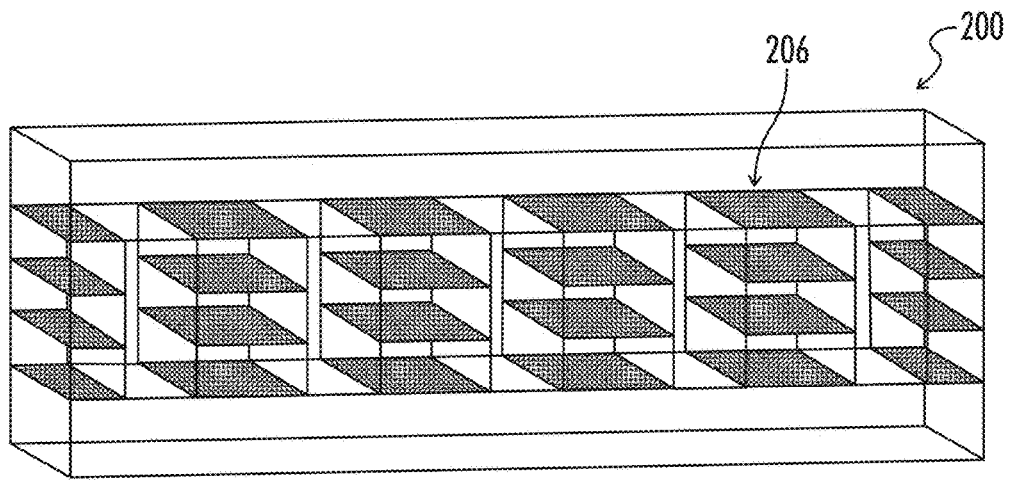
FIG. 18 is an energy density map characterized by sharp energy storage boundaries for the inductive apparatus according to the exemplary embodiment represented in FIG. 13.

Referring next to FIG. 18, an energy density map for an exemplary embodiment of an inductive apparatus 200 as disclosed herein is represented, wherein the thin energy storage elements clearly define a remarkably sharp boundary of the energy storage space 206. Consequently, the intensity of the magnetic field corresponding to the winding space is low, resulting in low eddy currents and hence low power loss in the winding. The quality factor of this exemplary inductor is 220, and the winding power loss is 0.56 W at a current having amplitude of 6A and a frequency of 300 kHz.

Typical applications of all above mentioned embodiments may include for example, and without express limitation to be derived therefrom, resonant converters, inverters or any other electronic circuits which require an inductor with high energy storage, compact size and low winding power losses.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct connection between the connected items or an indirect connection through one or more passive or active intermediary devices.

The terms "power converter" and "converter" unless otherwise defined with respect to a particular element may be used interchangeably herein and with reference to at least DC-DC, DC-AC, AC-DC, buck, buck-boost, boost, half-bridge, full-bridge, H-bridge or various other forms of power conversion or inversion as known to one of skill in the art.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. An inductive apparatus comprising:
a magnetic core comprising a plurality of vertically oriented posts and a plurality of horizontally oriented plates coupled to define an interior; and
a conductive winding extending through the interior;
wherein the vertical posts each comprise a first energy storage element located at a coupling of the vertical post to a first horizontally oriented plate, a second energy storage element located at a coupling of the vertical post to a second horizontally oriented plate, and a plurality of energy storage elements spaced along the vertical post between the first and second energy storage elements, and
wherein each of the first, second and further plurality of energy storage elements are coplanar in orientation with respect to the winding and having a substantially two dimensional structure.

2. The apparatus of claim 1, wherein each of the plurality of energy storage elements comprise gaps having a non-magnetic material disposed between adjacent portions of the respective vertical posts.

3. The apparatus of claim 1, wherein the conductive winding comprises one or more co-planar winding tracks extending through the interior.

4. The apparatus of claim 3, wherein a plurality of co-planar winding tracks are coupled in parallel along a single horizontal layer.

5. The apparatus of claim 3, wherein a plurality of co-planar winding tracks are vertically coupled in parallel.

6. The apparatus of claim 5, wherein the plurality of co-planar winding tracks correspond to respective layers in a multilayer printed circuit board.

7. The apparatus of claim 6, wherein the plurality of co-planar winding tracks comprise printed circuit board tracks vertically interconnected by vias extending therethrough.

8. The apparatus of claim 1, wherein the conductive winding has a physical thickness corresponding to a skin depth for the winding.

9. An inductive apparatus comprising:
- a magnetic core comprising a plurality of horizontally oriented plates and a plurality (n) of vertically oriented posts coupled to define a plurality (n−1) of interior portions; and
- a plurality of isolated conductive windings extending through the plurality of interior portions;
- wherein the vertical posts each comprise a first energy storage element located at a coupling of the vertical post to a first horizontally oriented plate, a second energy storage element located at a coupling of the vertical post to a second horizontally oriented plate, and a plurality of energy storage elements spaced along the vertical post between the first and second energy storage elements, and
- wherein each of the first, second and further plurality of energy storage elements are coplanar in orientation with respect to the windings and having a substantially two dimensional structure.

10. The apparatus of claim 9, wherein each of the plurality of energy storage elements comprise gaps having a non-magnetic material disposed between adjacent portions of the respective vertical posts.

11. The apparatus of claim 9, wherein at least a first of the plurality of conductive windings comprises one or more co-planar winding tracks extending through the interior.

12. The apparatus of claim 11, wherein the first winding comprises a plurality of co-planar winding tracks coupled in parallel along a single horizontal layer.

13. The apparatus of claim 11, wherein the first winding comprises a plurality of co-planar winding tracks vertically coupled in parallel.

14. The apparatus of claim 13, wherein the plurality of co-planar winding tracks correspond to respective layers in a multilayer printed circuit board.

15. The apparatus of claim 14, wherein respective pairs of the plurality of co-planar winding tracks comprise printed circuit board tracks vertically interconnected by vias extending therethrough.

16. The apparatus of claim 9, wherein the conductive windings have a physical thickness corresponding to a skin depth for the respective winding.

17. The apparatus of claim 9, wherein adjacent interior portions have a shared vertical post therebetween, and each shared vertical post and corresponding energy storage elements comprise cross-sections substantially larger than the respective cross-sections of unshared boundary vertical posts and corresponding energy storage elements.

18. An apparatus comprising:
- a printed circuit board having a plurality of co-planar layers in a horizontal orientation;
- a magnetic core comprising a plurality of horizontally oriented plates and a plurality (n) of vertically oriented posts coupled to define a plurality (n−1) of interior portions;
- a plurality of conductive winding segments integrated into respective layers of the printed circuit board and extending through the plurality of interior portions,
- wherein a first winding is defined by one or more of the winding segments, and at least one pair of corresponding ends for any adjacent winding segments are interconnected using vias through the respective printed circuit board layers, and
- wherein a second winding is defined by one or more of the winding segments, and at least one pair of corresponding ends for any adjacent winding segments are interconnected using vias through the respective printed circuit board layers;
- further wherein the vertical posts each comprise a first energy storage element located at a coupling of the vertical post to a first horizontally oriented plate, a second energy storage element located at a coupling of the vertical post to a second horizontally oriented plate, and a plurality of energy storage elements spaced along the vertical post between the first and second energy storage elements, and
- wherein each of the first, second and further plurality of energy storage elements are coplanar in orientation with respect to the windings and having a substantially two dimensional structure, and
- each of the plurality of energy storage elements comprise gaps having a non-magnetic material disposed between portions of the respective vertical posts and adjacent vertical post portions or horizontal plates.

* * * * *